United States Patent [19]
Kwon

[11] Patent Number: 6,043,679
[45] Date of Patent: Mar. 28, 2000

[54] LEVEL SHIFTER

[75] Inventor: Oh-Kyong Kwon, Seoul, Rep. of Korea

[73] Assignee: LG Semicon Co., Ltd., Cheongju, Rep. of Korea

[21] Appl. No.: 09/004,333

[22] Filed: Jan. 8, 1998

[30] Foreign Application Priority Data

Jan. 11, 1997 [KR] Rep. of Korea .......................... 97/565

[51] Int. Cl.[7] .................... H03K 19/0175; H03K 19/094
[52] U.S. Cl. ................................................ 326/68; 326/81
[58] Field of Search .................................. 326/80, 81, 82, 326/83, 86, 68, 121

[56] References Cited

U.S. PATENT DOCUMENTS

| | | | |
|---|---|---|---|
| 4,578,601 | 3/1986 | McAlister et al. | 307/475 |
| 5,034,629 | 7/1991 | Kinugasa et al. | 327/448 |
| 5,266,848 | 11/1993 | Nakagome et al. | 307/475 |
| 5,361,006 | 11/1994 | Cooperman et al. | 326/73 |
| 5,378,943 | 1/1995 | Dennard | 326/68 |

*Primary Examiner*—Michael Tokar
*Assistant Examiner*—A. Tran
*Attorney, Agent, or Firm*—Fleshner & Kim

[57] ABSTRACT

A level shifter, irrespective of a variation of a threshold voltage, is capable of changing input signals of 0 volt and 5 volts to the signals of −10 volts and 10 volts, respectively, without using an additional voltage and an inverted signal even when a threshold voltage of an NMOS transistor is 4 volts. The level shifter includes a voltage distributor, e.g., two level output inverter generates a driving signal for an NMOS transistor and a PMOS transistor irrespective of a threshold voltage variation with respect to input voltages of 0 volts and 5 volts. A two level input inverter drives the PMOS transistor and NMOS transistor in response to a driving signal from the two level output inverter and outputs a signal, the level of which is reduced as much as a threshold voltage at voltages of −10 volts and 10 volts. An inverter outputs the output signals from the two level input inverter as voltage signals of −10 volts and 10 volts.

28 Claims, 5 Drawing Sheets

LEVEL SHIFTER

BACKGROUND OF THE INVENTION

1. Field of the Invention

The present invention relates to a level shifter irrespective of a variation of a threshold voltage, and in particular to an improved level shifter irrespective of a variation of a threshold voltage which is capable of changing input signals of 0 volt and 5 volts to the signals of −10 volts and 10 volts (these voltages can vary depending on the application), respectively, without using an additional voltage and an inverted signal of the input signal even when a threshold voltage of an NMOS transistor is higher than 5 volts.

2. Background of the Related Art

As shown in FIG. 1, the related art level shifter includes a PMOS transistor 1 and an NMOS transistor 2 which are connected in series between a power voltage Vdd and a ground voltage Vss. A PMOS transistor 3 and an NMOS transistor 4 which are connected with the PMOS transistor 1 and the NMOS transistor 2 in a latch form and are connected in series between the power voltage Vdd and the ground voltage Vss.

The gate of the PMOS transistor 1 is connected with an output terminal, and the gate of the PMOS transistor 3 is connected with the drain of the NMOS transistor 2. In addition, the gate of the NMOS transistor 2 is connected to receive an input signal Vin, and the gate of the NMOS transistor 4 is connected to receive an input signal /Vin inverted by the inverter IN.

When a 5-volt signal is inputted as the input signal Vin, the NMOS transistor 2 and the PMOS transistor 3 are turned on, and the PMOS transistor 1 and the NMOS transistor 4 are turned off. An output signal Vout of a high voltage level is outputted through the output terminal.

When a 0-volt signal is inputted as the input signal, the NMOS transistor 4 and the PMOS transistor 1 are turned on, and the NMOS transistor 2 and the PMOS transistor 3 are turned off. An output signal Vout of a low voltage level is outputted through the output terminal.

In the related art level shifter, the input signal is inverted by the inverter IN, and then the inverted signal is compared with an input signal Vin. When the threshold voltage of the NMOS transistor exceeds about 5 volts which is often the case for a polycrystalline silicon thin film transistor (Poly—Si TFT), the NMOS transistor 2 is not turned on, so that the level shifter does not operate. In order to solve this problem, additional voltage should be provided in addition to the voltage supplies of 0 volts and 5 volts. Therefore, the number of input pads of the panel is increased, and a voltage supply circuit should be additionally provided. When the threshold voltage varies greatly, which is also often the case for Poly—Si TFT, the operation speed of the above-described level shifter is influenced very much.

The above references are incorporated by reference herein where appropriate for appropriate teachings of additional or alternative details, features and/or technical background.

SUMMARY OF THE INVENTION

Accordingly, it is an object of the present invention to overcome the aforementioned problems encountered in the related art.

It is another object of the present invention to provide a level shifter which shifts an output voltage level irrespective of a variation of a threshold voltage.

Another object of the present invention is to change the input signals of 0 volt and 5 volts to the signals of −10 volts and 10 volts, respectively, without using an additional voltage and an inverted signal even when a threshold voltage of a transistor is about 4 volts or higher.

To achieve the above objects, there is provided a level shifter irrespective of a variation of a threshold voltage which includes a 2-level output inverter for generating a driving signal for an NMOS transistor and a PMOS transistor irrespective of a threshold voltage variation with respect to input voltages of 0 volts and 5 volts, a 2-level input inverter for driving the PMOS transistor and NMOS transistor in response to a driving signal from the 2-level output inverter and outputting a signal the level of which is reduced as much as a threshold voltage at voltages of −10 volts and 10 volts, and an inverter for outputting the output signals from the 2-level input inverter as voltage signals of −10 volts and 10 volts.

The present invention can be achieved in parts or in a whole by a level shifter coupled for receiving an input signal having first low and high potential levels, comprising a voltage distributor receiving the input signal and distributing potential levels at first and second nodes to output first and second signals; and an output circuit responsive to the first and second signals such that an output signal is provided to an output node, the output signal having second low and high potential levels, wherein the first low potential level of the input signal and the second high potential level of the output signal is greater than the second low potential level of the output signal and the first high potential level of the input signal, respectively.

The present invention can also be achieved in parts or in a whole by a voltage distributor comprising a first transistor having first and second electrodes and a control electrode, the control electrode receiving an input signal and the second electrode coupled to a first node; a second transistor having first and second electrodes and a control electrode, the control and second electrodes being coupled to a second node; and a switch coupled to the first and second nodes and responsive to the input signal, wherein first and second output signals are provided at the first and second nodes, respectively, the input signal having first low and high potential levels, the first output signal having first output low and high potential levels, and second output signals having second output low and high potential levels, and wherein the second output low potential level is no greater than a threshold voltage level of the second transistor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
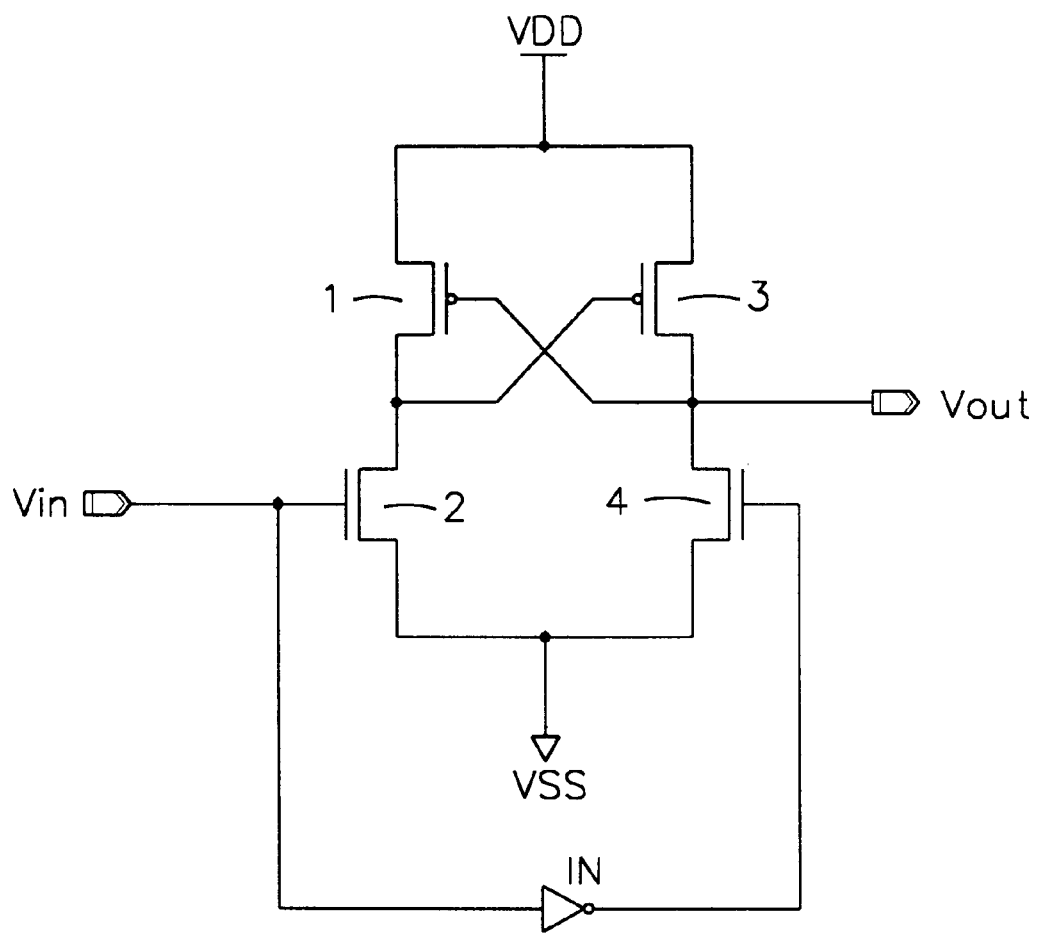
FIG. 1 is a circuit diagram illustrating a related level shifter.
Figure 2:
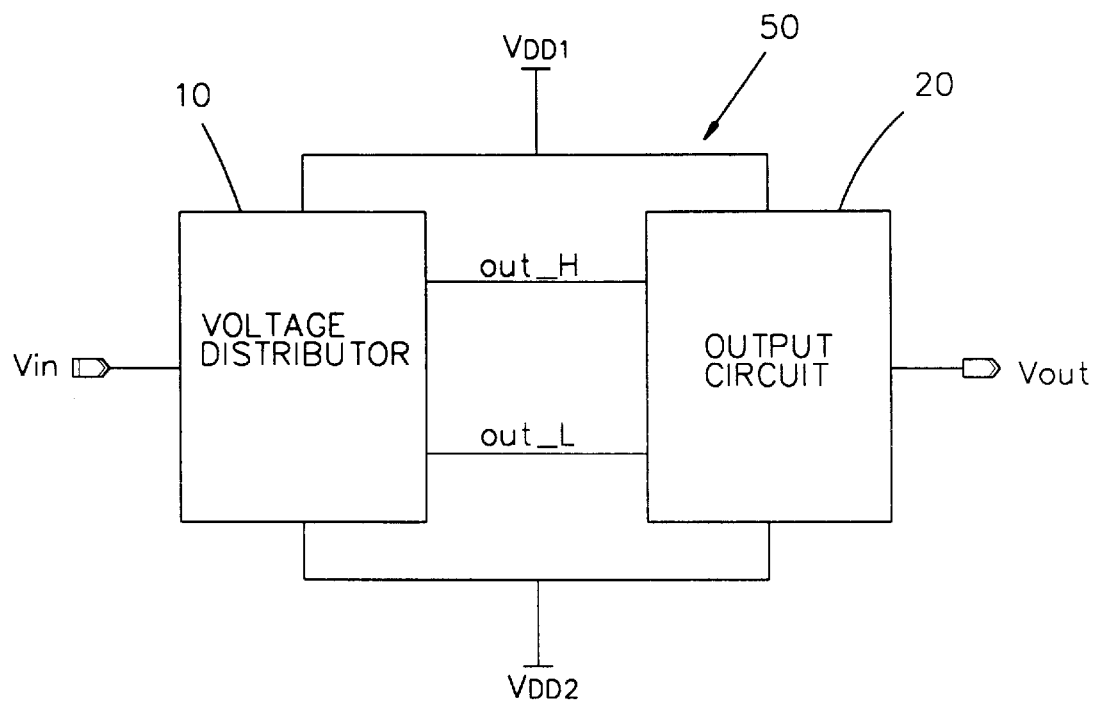
FIG. 2 is a block diagram illustrating a level shifter according to the present invention.

FIG. 2 illustrates a level shifter 50 in accordance with the present invention, which includes a voltage distributor 10 receiving an input signal, and an output circuit 20 receiving first and second signals out_H and out_L. The voltage distributor 10 distributes the applied voltages $V_{DD1}$ and $V_{DD2}$ to output the signals out_H and out_L. Even when a threshold voltage of the transistors in the voltage distributor 10 varies greatly, the output signals out_H and out_L are generated in response to the input signal Vin. The output circuit 20 receives the output signals out_H and out_L to provide the level shifted output signal Vout.

Figure 3:
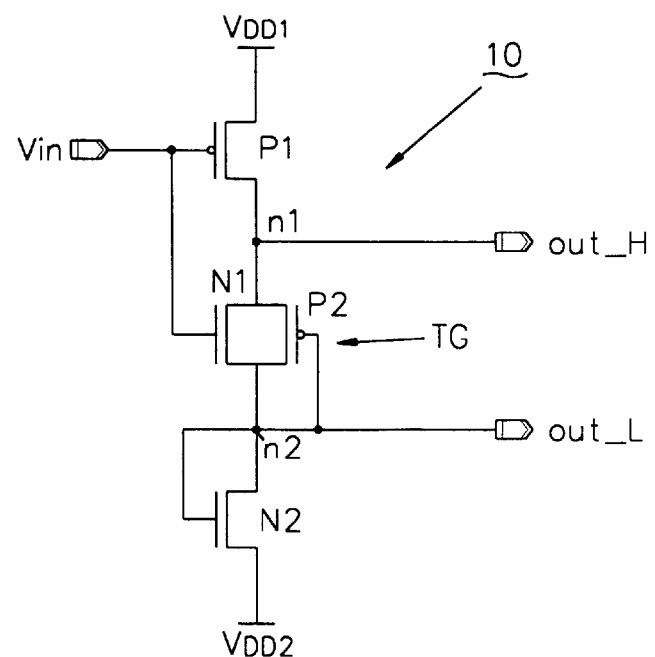
FIG. 3 is a circuit diagram illustrating a voltage distributor of FIG. 2.

FIG. 3 illustrates a preferred embodiment of the voltage distributor 10, which preferably comprises a two-level output inverter, i.e., an inverter providing two output signals of out_H and out_L at first and second nodes n1 and n2. The two level output inverter 10 includes a PMOS transistor P1, a transmission gate TG, and an NMOS transistor N2 connected in series between the applied voltages $V_{DD1}$ and $V_{DD2}$. The transmission gate TG consists of an NMOS transistor N1 and a PMOS transistor P2. The transistors P1 and N2 are connected to the transmission gate TG at the first and second nodes n1 and n2, respectively, to provide the output signals out_H and out_L. The gates of the PMOS transistor P1 and the NMOS transistor N1 are commonly connected with the input terminal to receive the input signal Vin, and the gates of the PMOS transistor P2 and the NMOS transistor N2 are commonly connected at the second node n2.

Figure 4:
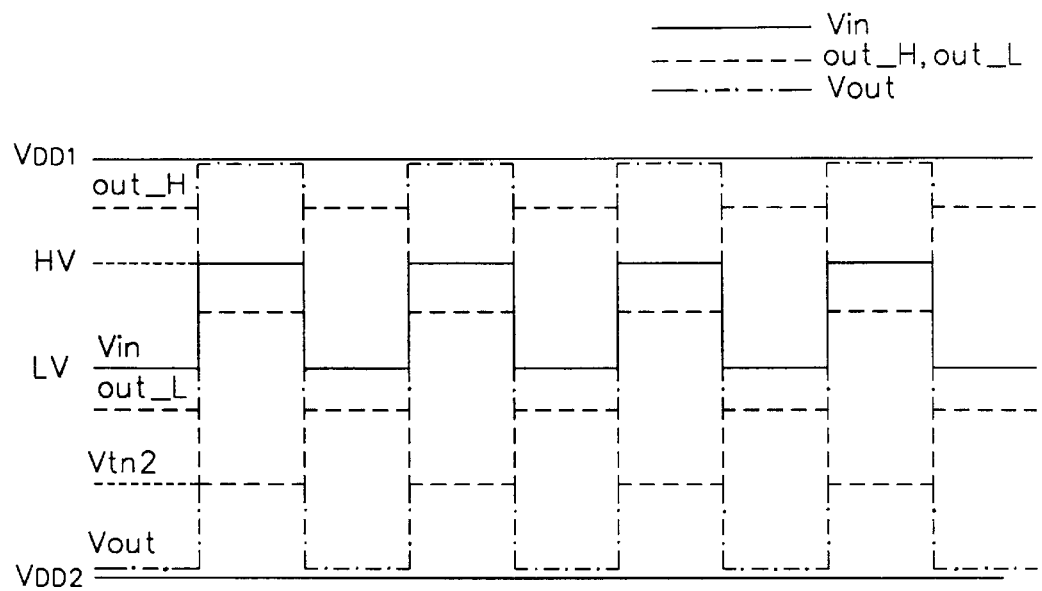
FIG. 4 is wave form diagrams of signals from elements of FIG. 3.

FIG. 4 illustrates the general operation of the level shifter 50 of the present invention. When an input signal Vin of a first low potential L-volts is inputted, the PMOS transistor P1 of the two level output inverter 10 is turned on, and the NMOS transistor N1 is turned off or slightly turned on, whereby the PMOS transistor P2 and the NMOS transistor N2 distribute the voltages $V_{DD1}$ and $V_{DD2}$ at the nodes n1 and n2 to output the signals out_H and out_L of a high potential level. When an input signal Vin of a first high potential H-volts is inputted, the NMOS transistor N1 is turned on, and the PMOS transistor P1 is turned off or slightly turned on, whereby the potentials stored at the nodes n1 and n2 are discharged by the NMOS transistor N1 and the NMOS transistor N2 until the signal out_L at the second node n2 substantially equals a threshold voltage Vtn2 of the NMOS transistor N2. The output signals out_H and out_L have inverted phases compared to the input signal Vin.

When an input signal Vin is a high potential, the potential of the signal out_L at the node n2 becomes a threshold voltage Vtn2 of the NMOS transistor N2. When the input signal Vin is a low potential, the potential of the signal out_L thereof becomes higher than the threshold voltage Vtn of the NMOS transistor N2,. Based on the signals out_H and out_L, the output circuit 20 outputs an output signal Vout of output high and low potential levels. The output high and low potential levels are in phase with the input signal Vin and are approximately shifted to the applied $V_{DD1}$ and $V_{DD2}$. The NMOS transistor N2 acts to measure the threshold voltage Vtn2 of the NMOS transistor and to distribute the voltage. Even when the threshold voltage Vtn2 of the NMOS transistor N2 varies, the output signals out_H and out_L is outputted at the nodes n1 and n2, and the level shifter is operated even when the threshold voltage Vtn is varied.

Figure 5A:
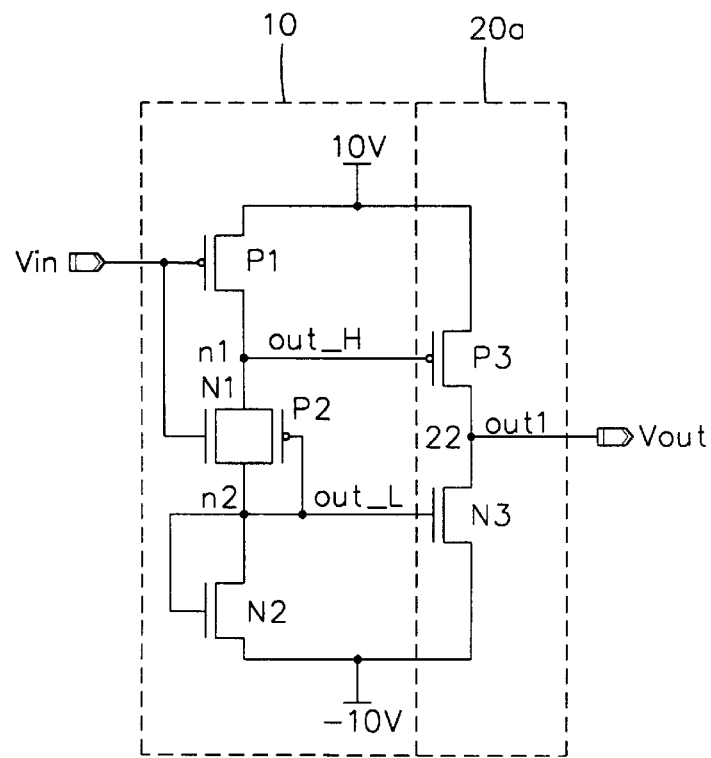
FIG. 5A is a circuit diagram of the level shifter in accordance with an embodiment of the present invention.

FIG. 5A illustrates a first embodiment of a level shifter in accordance with the present invention. As shown, the construction of the voltage distributor 10 is the same as FIG. 3, and a detailed description is omitted. The applied voltages $V_{DD1}$ and $VDD_2$ in this preferred embodiment equal 10 volts and −10 volts (V), respectively. The output circuit 20a in this preferred embodiment is a two level input inverter, i.e., an inverter having two inputs. The two level input inverter 20a includes PMOS and NMOS transistors P3 and N3 coupled in series between the applied voltages of 10 V and −10 V to provide the output signal Vout at a node out1. The gates of the transistors P3 and N3 are coupled to the nodes n1 and n2, respectively.

Figure 5B:
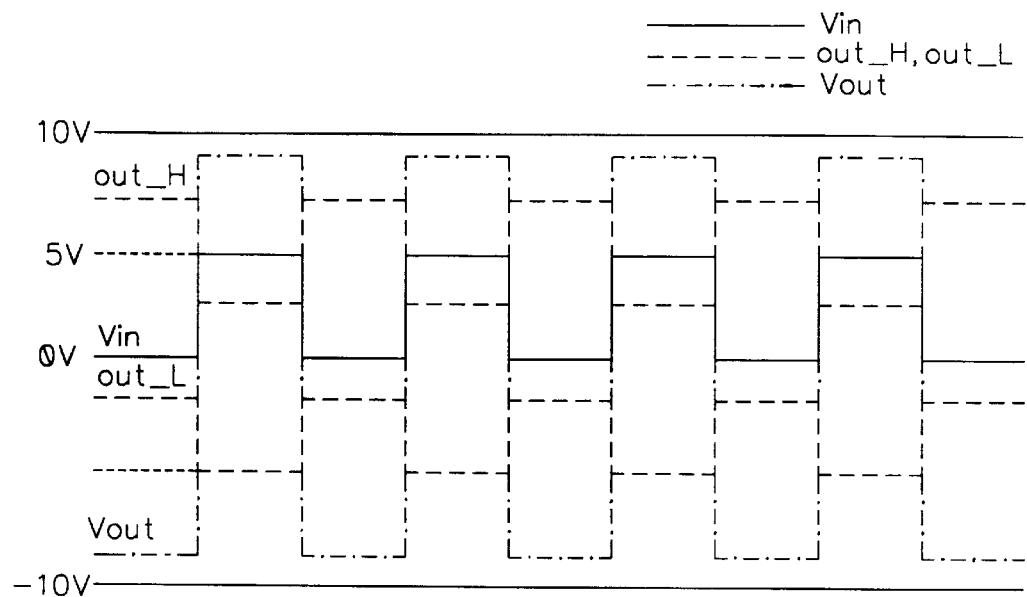
FIG. 5B is wave form diagrams of the circuit in FIG. 5A.

FIG. 5B illustrates a waveform diagram for the operation of the level shifter illustrated in FIG. 5A, where the input signal Vin changes between 0-volts and 5-volts. When a 0-volt signal Vin is inputted, the PMOS transistor P1 of the two level output inverter 10 is turned on, and the NMOS transistor N1 is turned off or slightly turned on, whereby the PMOS transistor P2 and the NMOS transistor N2 distribute the voltage to output high potential levels of the output signals out_H and out_L. The output signal out_L has a potential level which is higher than the threshold voltage Vtn2 of the NMOS transistor N2. Since the output signal out_H is lower than the threshold voltage of the PMOS transistor P3, the PMOS transistor P3 of the two level input inverter 20a is turned off. Since the output signal out_L is higher than the threshold voltage of the NMOS transistor N3, the NMOS transistor N3 is turned on, whereby an output signal Vout of about −8 V to −10 V is provided at the node out1.

When a 5-volt signal Vin is inputted, the NMOS transistor N1 is turned on, and the PMOS transistor P1 is turned off or slightly turned on, whereby the potential levels at nodes n1 and n2 stored in the output terminals 21 and 22 are discharged by the NMOS transistor N1 until the voltage level of the signal out_L equals a threshold voltage Vtn2 of the NMOS transistor N2. Since the output signal out_H is higher than the threshold voltage of the PMOS transistor P3, the PMOS transistor P3 is turned on. The transistor N3 is turned off since the signal out_L is lower than the threshold voltage of the NMOS transistor N3. Accordingly, an output signal Vout of about 8 V to 10 V is provided at the node out1.

Figure 6:
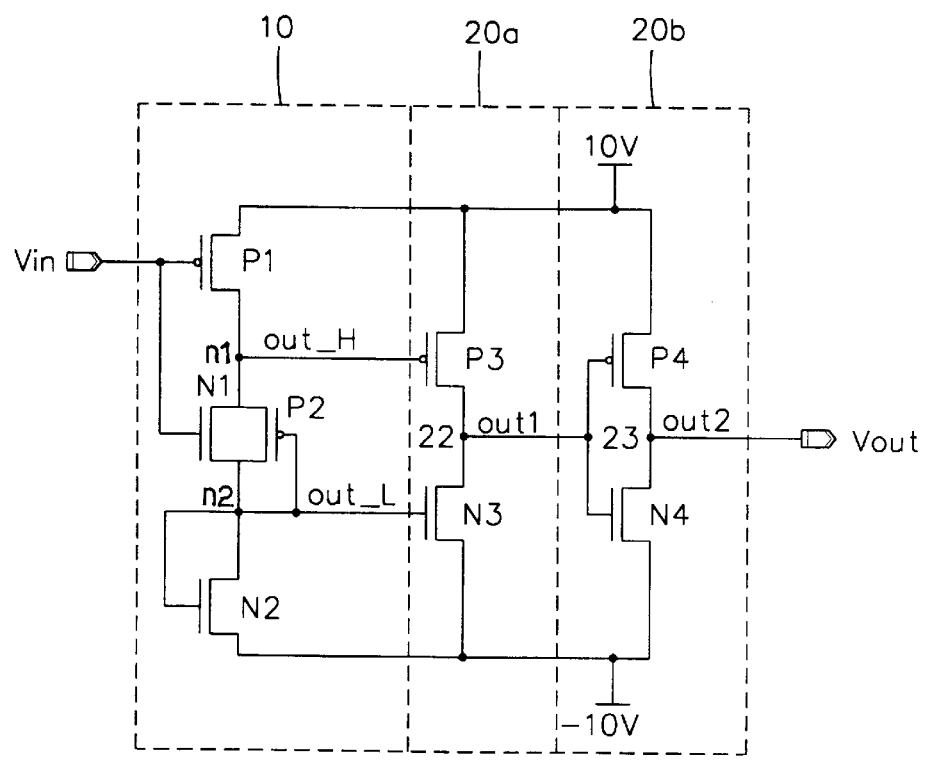
FIG. 6 is a circuit diagram of the level shifter in accordance with another embodiment of the present invention.

FIG. 6 illustrates another embodiment of the present invention. In this embodiment, an inverter 20b is connected to the two level input inverter 20a. The inverter 20b includes a PMOS transistor P4 and an NMOS transistor N4 coupled in series between the applied voltages of 10 V and −10 V. The gates of the transistors P4 and N4 are connected to the node out1, and the output signal Vout is provided at a node out2. The operation of the voltage distributor 10 and the two level input inverter 20a is the same as FIG. 5A, and description thereof is omitted. The inverter 20a inverts the signal provided at the node out1, and an output signal Vout of about 10 V and −10 V is provided at the node out2. The output signal Vout has an inverted phase compared to the input signal Vin.

Figure 7A:
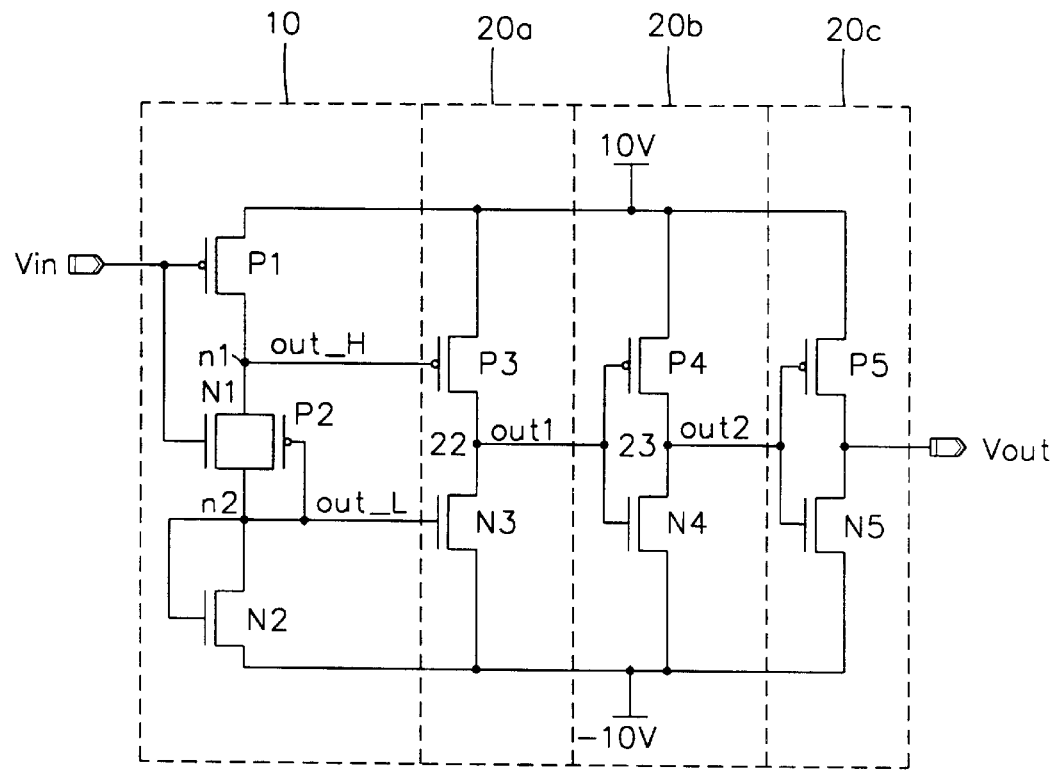
FIG. 7A is a circuit diagram of the level shifter in accordance with another embodiment of the present invention.
Figure 7B:
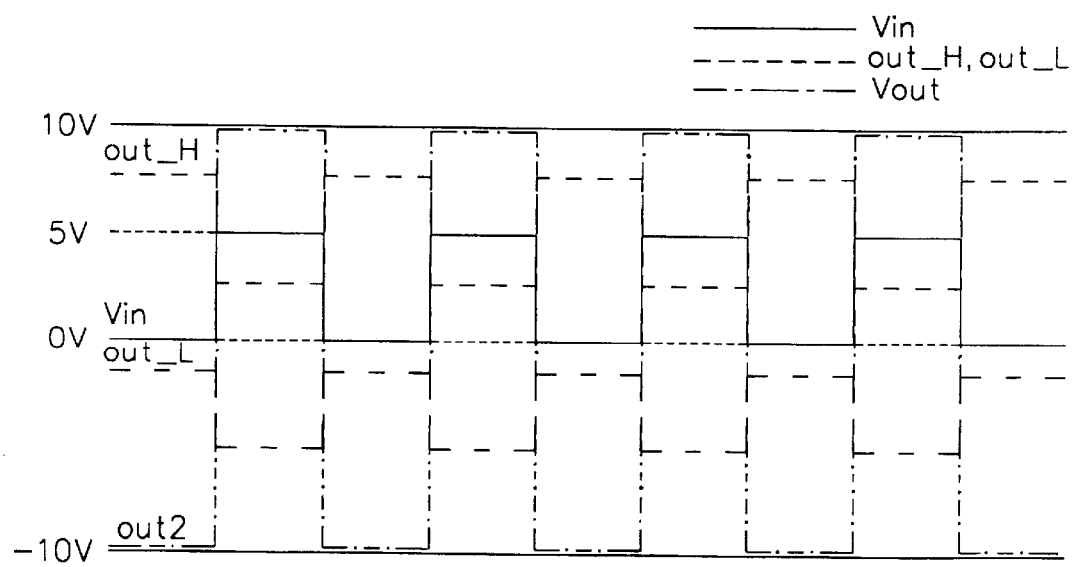
FIG. 7B is wave form diagrams of signals from elements of the circuit illustrated in FIG. 7A.

FIG. 7A illustrates another embodiment of the present invention. The voltage distributor 10, two level input inverter 20a and the inverter 20b are the same as FIG. 6, but this embodiment includes another inverter 20c. The operation is the same, as described above, and the inverter 20c inverts the signal provided at the node out2 such that the output signal Vout has the same phase as the input signal Vin, as shown in FIG. 7B.

When the absolute value of the threshold voltage exceeds 7 volts, since the output signal out1 from the 2-level input inverter 20 is shifted from −10 volts to −8 volts with respect to the 0-volt input signal Vin, and the output signal out1 therefrom is shifted from 10 volts to 8 volts with respect to the 5-volt input signal Vin, as shown in FIG. 6, the signal is inverted to 10 volts and −10 volts, respectively, using the inverter 20b and then is inverted by the inverter 20c, whereby it is possible to drive a large load device.

As described above, in the level shifter irrespective of variation of a threshold voltage according to the present invention, there is provided a MOS transistor which acts to measure a threshold voltage Vtn of the NMOS transistor and serves as a voltage distributor. The level shifter is normally operated even when the threshold voltage is ranged from 2 volts to a maximum 7 volts, and in addition, it is possible to obtain output voltages of −10 volts and 10 volts using voltages of 0 volts and 5 volts without using an additional voltage or an inverted signal.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A level shifter coupled for receiving an input signal having first low and high potential levels, comprising:
   a voltage distributor receiving the input signal and distributing potential levels at first and second nodes to output first and second signals, respectively; and
   an output circuit responsive to the first and second signals such that an output signal is provided to an output node, the output signal having second low and high potential levels, wherein the first low potential level of the input signal and the second high potential level of the output signal is greater than the second low potential level of the output signal and the first high potential level of the input signal, respectively.

2. The level shifter of claim 1, wherein the first and second signals have an inverted phase of the input signal.

3. The level shifter of claim 1, wherein the first signal has third low and high potential levels, the third high potential level having a potential level which is between the first and second high potential levels.

4. The level shifter of claim 3, wherein the third low potential level is greater than the first low potential level.

5. The level shifter of claim 3, wherein the second signal has fourth low and high potential levels, which are lower than the first low potential level.

6. The level shifter of claim 5, wherein the fourth low potential level is between first and second low potential levels.

7. The level shifter of claim 1, wherein said voltage distributor is a two-level output inverter.

8. The level shifter of claim 1, wherein said voltage distributor includes:
   a first transistor having first and second electrodes and a control electrode, wherein the first transistor receives the input signal and is coupled to the first node;
   a switch coupled to the first and second nodes and responsive to the input signal; and
   a second transistor having first and second electrodes and a control electrode, the control and second electrodes being coupled to the second node.

9. The level shifter of claim 8, wherein said first and second transistors are opposite conductivity type transistors.

10. The level shifter of claim 8, wherein the control electrode of said first transistor receives the input signal and the second electrode of the first transistor is coupled to the first node.

11. The level shifter of claim 10, wherein said switch is a transmission gate.

12. The level shifter of claim 11, wherein said transmission gate includes third and fourth transistors of opposite conductivity types, each transistor having first and second electrodes and a control electrode.

13. The level shifter of claim 12, wherein said third and fourth transistors are PMOS and NMOS transistors.

14. The level shifter of claim 12, wherein the first electrodes of the third and fourth transistors are coupled to the first node, the second electrodes of the third and fourth transistors and the control electrode of the third transistor are coupled to the second node, the control electrode of the fourth transistor is coupled for receiving the input signal.

15. The level shifter of claim 1, wherein said output circuit includes a two-level input inverter.

16. The level shifter of claim 1, wherein said output circuit comprises fifth and sixth transistors coupled in series at a third node, each transistor having first and second electrodes and a control electrode, the second electrodes of the fifth and sixth transistors being coupled to the third node and the control electrodes of the fifth and sixth transistor being coupled for receiving the first and second signals, respectively.

17. The level shifter of claim 1, wherein said output circuit comprises:
   a first inverter having two inputs to receive the first and second signals; and
   a second inverter having an input to receive an output of the first inverter and outputting the output signal.

18. The level shifter of claim 17, wherein said first inverter comprises fifth and sixth transistors coupled in series at a third node, each transistor having first and second electrodes and a control electrode, the second electrodes of the fifth and sixth transistors being coupled to the third node and the control electrodes of the fifth and sixth transistors being coupled for receiving the first and second signals, respectively.

19. The level shifter of claim 18, wherein said second inverter comprises seventh and eighth transistors coupled in series at a fourth node, each transistor having first and second electrodes and a control electrode, the second electrodes of the seventh and eighth transistors being coupled to the fourth node and the control electrodes of the seventh and eighth transistors being coupled to the third node.

20. The level shifter of claim 1, wherein said output circuit comprises:
   a first inverter having two inputs to receive the first and second signal;
   a second inverter having an input to receive an output of said first inverter; and
   a third inverter having an input to receive an output of said second inverter and outputting the output signal.

21. The level shifter of claim 20, wherein said first inverter comprises fifth and sixth transistors coupled in series at a third node, each transistor having first and second electrodes and a control electrode, the second electrodes of the fifth and sixth transistors being coupled to the third node and the control electrodes of the fifth and sixth transistors being coupled for receiving the first and second signals, respectively.

22. The level shifter of claim 21, wherein said second inverter comprises seventh and eighth transistors coupled in series at a fourth node, each transistor having first and second electrodes and a control electrode, the second electrodes of the seventh and eighth transistors being coupled to the fourth node and the control electrodes of the seventh and eighth transistors being coupled to the third node.

23. The level shifter of claim 22, wherein said third inverter comprises ninth and tenth transistors coupled in series at the output node, each transistor having first and second electrodes and a control electrode, the second electrodes of the ninth and tenth transistors being coupled to the output node and the control electrodes of the ninth and tenth transistors being coupled to the fourth node.

24. A voltage distributor comprising:
a first transistor having first and second electrodes and a control electrode, the control electrode receiving an input signal and the second electrode coupled to a first node;
a second transistor having first and second electrodes and a control electrode, the control and second electrodes being coupled to a second node; and
a switch coupled to the first and second nodes and responsive to the input signal, wherein
first and second output signals are provided at the first and second nodes, respectively, the input signal having first low and high potential levels, the first output signal having first output low and high potential levels, and second output signals having second output low and high potential levels, and wherein
the second output low potential level is no greater than a threshold voltage level of said second transistor.

25. The voltage distributor of claim 24, wherein, said first and second transistors are opposite conductivity type transistors.

26. The voltage distributor of claim 24, wherein said switch is a transmission gate.

27. The voltage distributor of claim 26, wherein said transmission gate includes third and fourth transistors of opposite conductivity types, each transistor having first and second electrodes and a control electrode.

28. The level shifter of claim 27, wherein the first electrodes of the third and fourth transistors are coupled to the first node, the second electrodes of the third and fourth transistors and the control electrode of the third transistor are coupled to the second node, the control electrode of the fourth transistor is coupled for receiving the input signal.

* * * * *